United States Patent
Baek (10) Patent No.: US 9,001,589 B2
(45) Date of Patent: Apr. 7, 2015

(54) METHOD FOR ERASING CHARGE TRAP DEVICES

(71) Applicant: SK Hynix Inc., Icheon-si, Gyeonggi-do (KR)

(72) Inventor: Kwang Ho Baek, Icheon-si (KR)

(73) Assignee: SK Hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 13/777,930

(22) Filed: Feb. 26, 2013

(65) Prior Publication Data

US 2014/0153340 A1   Jun. 5, 2014

(30) Foreign Application Priority Data

Dec. 3, 2012   (KR) .................. 10-2012-0139018

(51) Int. Cl.
- *G11C 16/06* (2006.01)
- *G11C 11/34* (2006.01)
- *G11C 16/04* (2006.01)
- *G11C 11/56* (2006.01)
- *G11C 16/14* (2006.01)
- *G11C 16/34* (2006.01)

(52) U.S. Cl.
CPC ........ *G11C 16/0466* (2013.01); *G11C 11/5635* (2013.01); *G11C 16/14* (2013.01); *G11C 16/3445* (2013.01)

(58) Field of Classification Search
CPC .. G11C 16/16; G11C 16/344; G11C 16/3445; G11C 11/5635
USPC .......... 365/185, 203, 189, 100, 126, 185.03, 365/185.22, 185.09
See application file for complete search history.

(56) References Cited

U.S. PATENT DOCUMENTS

| | | | |
|---|---|---|---|
| 6,222,772 B1* | 4/2001 | Choi et al. | 365/185.22 |
| 2003/0076710 A1* | 4/2003 | Sofer et al. | 365/185.22 |

FOREIGN PATENT DOCUMENTS

| | | |
|---|---|---|
| KR | 10-2009-0106897 | 12/2009 |
| KR | 10-2010-0117903 | 4/2010 |

\* cited by examiner

*Primary Examiner* — Kretelia Graham
*Assistant Examiner* — Muhammad Islam
(74) *Attorney, Agent, or Firm* — Haynes and Boone, LLP (57) ABSTRACT

A method of erasing charge trap devices includes applying a first erase voltage to the charge trap devices; applying an erase verify voltage to the charge trap devices; performing a current first fail bit check operation including comparing a first number of charge trap devices, which are determined to be an erase fail based on the erase verify voltage, to a first reference value and determining a pass or fail based on the comparison result; when the current first fail bit check operation is determined to be a fail, determining whether a previous first fail bit check operation performed during a previous erase loop was passed or not; and when the previous first fail bit check operation performed during the previous erase loop was passed, setting a third erase voltage to a same level as a second erase voltage used during the previous erase loop.

23 Claims, 7 Drawing Sheets

METHOD FOR ERASING CHARGE TRAP DEVICES

CROSS-REFERENCES TO RELATED APPLICATION

The present application claims priority under 35 U.S.C. §119(a) to Korean application number 10-2012-0139018, filed on Dec. 3, 2012, in the Korean Intellectual Property Office, which is incorporated herein by reference in its entirety.

BACKGROUND

1. Technical Field

The present invention relates to a semiconductor memory device, and more particularly, to a method of erasing a nonvolatile memory device including charge trap devices.

2. Related Art

In general, a semiconductor memory device may be classified into either a volatile memory device or a nonvolatile memory device. The volatile memory device loses data stored therein when power is cut off, and the nonvolatile memory device maintains data stored therein even through power is cut off. The nonvolatile memory device includes various types of memory cells.

The nonvolatile memory device may be implemented as a flash memory device, a ferroelectric RAM (FRAM) using a ferroelectric capacitor, a magnetic RAM (MRAM) using a tunneling magneto-resistive (TMR) layer, a phase change memory device using chalcogenide alloys, a resistive memory RAM (ReRAM) using transition metal oxide and the like, depending on the structure of the memory cells.

It would be advantageous to have improved semiconductor memory devices with an improved reliability.

SUMMARY

According to some embodiments, a method of erasing a nonvolatile memory device including charge trap devices is capable of preventing characteristic reduction caused by back tunneling.

In one embodiment, a method of erasing charge trap devices includes applying a first erase voltage to the charge trap devices; applying an erase verify voltage to the charge trap devices; determining erase states of the charge trap devices; performing a current first fail bit check operation including comparing a first number of charge trap devices, which are determined to be an erase fail based on the erase verify voltage, to a first reference value and determining a pass or fail based on the comparison result; when the current first fail bit check operation is determined to be a fail, determining whether a previous first fail bit check operation performed during a previous erase loop was passed or not; and when the previous first fail bit check operation performed during the previous erase loop was passed, setting a third erase voltage to a same level as a second erase voltage used during the previous erase loop.

In another embodiment, a method of erasing charge trap devices includes applying a first erase voltage to the charge trap devices; performing a first erase verify operation including applying a first erase verify voltage to the charge trap devices; determining erase states of the charge trap devices, and determining a pass or fail depending on a first number of charge trap devices which are determined to be an erase fail based on the first erase verify voltage; when the current first erase verify operation is determined to be a fail, determining whether a previous first erase verify operation performed during a previous erase loop was passed or not; and when the previous first erase verify operation performed during the previous erase loop is determined to be a pass, setting a third erase voltage to a same level as a second erase voltage used during the previous erase loop.

BRIEF DESCRIPTION OF THE DRAWINGS

Features, aspects, and embodiments are described in conjunction with the attached drawings, in which.

DETAILED DESCRIPTION

Hereinafter, methods of erasing a nonvolatile memory device according to the present invention will be described below with reference to the accompanying drawings through exemplary embodiments.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

According to some embodiments, a flash memory device may include a memory cell having a stacked gate structure. The stacked gate structure may include a tunnel oxide layer, a floating gate electrode, a gate dielectric layer, and a control gate electrode which are sequentially stacked over a channel region of the memory cell. In the memory cell of the stacked gate structure, the tunnel oxide layer may be formed with a large thickness to improve the lifetime of the memory cell. However, with increases in integration of nonvolatile memory devices such as the flash memory device, a thickness of the tunnel oxide layer has gradually decreased. Accordingly, electric charges may leak through the tunnel oxide layer, thereby degrading the reliability of the memory cell.

In order to solve this problem, research and development have been actively conducted on a new concept of memory elements. Among the memory elements, much attention is being paid to a nonvolatile memory device having a charge trap device (CTD) with a silicon-oxide-nitride-oxide-silicon (SONOS) structure as a unit cell.

The charge trap device with a SONOS structure may include a silicon substrate, a tunneling layer, a charge trap layer, a blocking layer, and a control gate electrode which are sequentially stacked therein. The silicon substrate may include a channel region formed therein. In some embodiments, the charge trap layer may be formed of nitride. The charge trap device may be programmed or erased by a mechanism to inject or remove electrons.

When a high electric field is formed between the semiconductor substrate and the control gate electrode so as to erase the charge trap device, back tunneling may occur. Specifically, electrons of the control gate electrode may be introduced into the charge trap layer through the blocking layer used to electrically separate the charge trap layer and the control gate electrode. When back tunneling occurs, the charge trap device may not be erased but may be programmed instead, even though an erase voltage is applied. Thus, the erase characteristics of the charge trap device are degraded.

Figure 1:
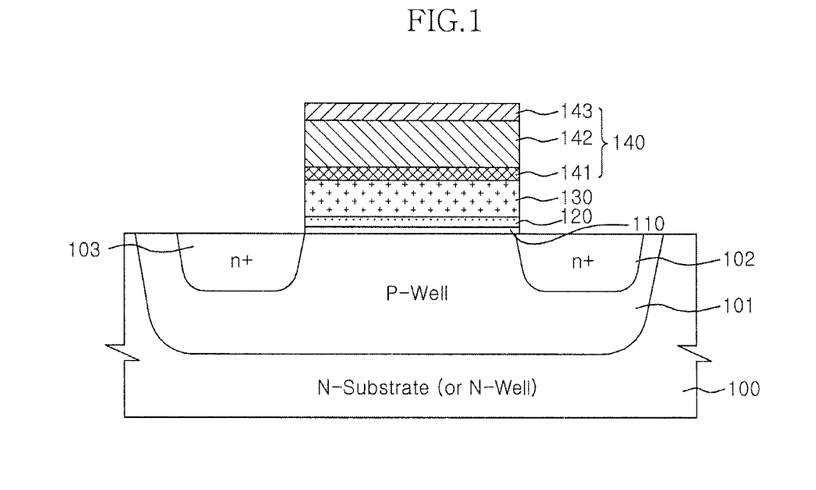
FIG. 1 is a simplified cross-sectional view of a charge trap device of a nonvolatile memory device according to some embodiments.

FIG. 1 is a simplified cross-sectional view of a charge trap device (CTD) of a nonvolatile memory device according to some embodiments.

Referring to FIG. 1, a P-well 101 is formed over an N-substrate 100. In some examples, when a triple well structure is used, the N-substrate 100 may be changed to a P-substrate. In some examples, an N-well may be formed over the P-substrate, and the P-well 101 may be formed over the N-well.

Over the P-well 101, n+ source/drain impurity regions 102 and 103 are formed. The n+ source/drain impurity regions 102 and 103 are isolated from each other by a channel region formed inside the P-well 101.

A tunneling layer 110 is formed over the channel region formed between the n+ source/drain impurity regions 102 and 103. In some examples, the tunneling layer 110 may have a single-layer or multilayer structure formed of an insulator such as silicon oxide ($SiO_2$).

A charge trap layer 120 is formed over the tunneling layer 110. In some examples, the charge trap layer 120 may be formed of silicon nitride. The charge trap layer 120 traps charges injected through the tunneling layer 110 from the channel region.

A blocking layer 130 is formed over the charge trap layer 120. In some examples, the blocking layer 130 may have a single-layer or multilayer structure formed of an insulator such as $SiO_2$, an oxide-nitride-oxide (ONO) layer, and/or aluminum oxide ($Al_2O_3$).

A control gate electrode 140 is formed over the blocking layer 130. In some examples, the control gate electrode 140 may have a stacked structure of a barrier metal 141, a polysilicon layer 142, and a metal electrode layer 143. In some examples, when the control gate electrode 140 is formed of polysilicon, the charge trap device may have a silicon-oxide-nitride-oxide-silicon (SONOS) structure.

Figure 2:
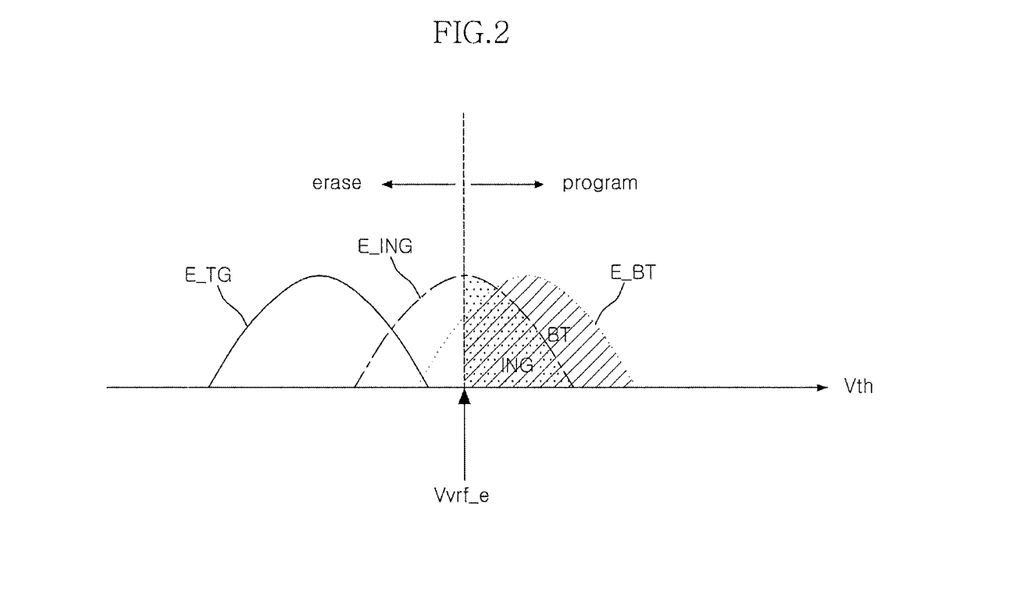
FIG. 2 is a simplified threshold voltage distribution diagram for explaining a method of detecting a back tunneling effect of the nonvolatile memory device according to some embodiments.

FIG. 2 is a simplified threshold voltage distribution diagram for explaining a method of detecting a back tunneling effect of the nonvolatile memory device according some embodiments. In some examples, when a high electric field is formed between the semiconductor substrate 100 and the control gate electrode 140 of FIG. 1 so as to erase the charge trap device, electrons of the control gate electrode 140 may be introduced into the charge trap layer 120 through the blocking layer 130. This is sometimes referred to as back tunneling.

When a charge trap device is normally erased, the charge trap device has a lower threshold voltage than an erase verify voltage Vvrf_e. In some examples, the erased charge trap device has a threshold voltage included in a threshold voltage distribution E_TG. Furthermore, a charge trap device which is being erased may have a lower or higher threshold voltage than the erase verify voltage Vvrf_e. In some examples, the charge trap device which is being erased may have a threshold voltage included in a threshold voltage distribution E_ING. When the charge trap device has a threshold voltage that is higher than the erase verify voltage Vvrf_e, that is, the charge trap device has a threshold voltage included in a region ING, the charge trap device is determined to be a fail during the erase verify operation.

When back tunneling occurs, the threshold voltage distribution of charge trap devices may not decrease below the erase verify voltage Vvrf_e, but may be higher than the erase verify voltage Vvrf_e, even though an erase voltage is applied. In other words, when back tunneling occurs, the charge trap devices may not be erased but may instead be programmed. In some examples, when back tunneling occurs, one or more charge trap devices may have a threshold voltage included in a threshold voltage distribution E_BT. This means that a number of the one or more charge trap devices having a threshold voltage higher than the erase verify voltage Vvrf_e may increase (as noted by the region BT which is wider than the region ING). Any charge trap devices having a threshold voltage included in the region BT are also determined to be a fail during the erase verify operation.

According to some embodiments, when a number of erase fail bits detected during a current erase loop is larger than a number of erase fail bits detected during a previous erase loop, it may be determined that back tunneling occurred in the charge trap devices. When back tunneling is detected in this manner, the erase voltage level is set to an erase voltage level at which back tunneling did not occur (in some examples, the erase voltage level is set to an erase voltage level used during the previous erase loop). Then, a next erase loop is performed using the set erase voltage level.

According to some embodiments, a variety of methods may exist for determining whether the charge trap device passes or fails an erase operation based on a previous number of erase fail bits detected in the previous loop and a current number of erase fail bits detected in the current erase loop. Hereafter, various embodiments of methods of determining whether the charge trap device pass or fail an erase operation will be described in further detail.

Figure 3:
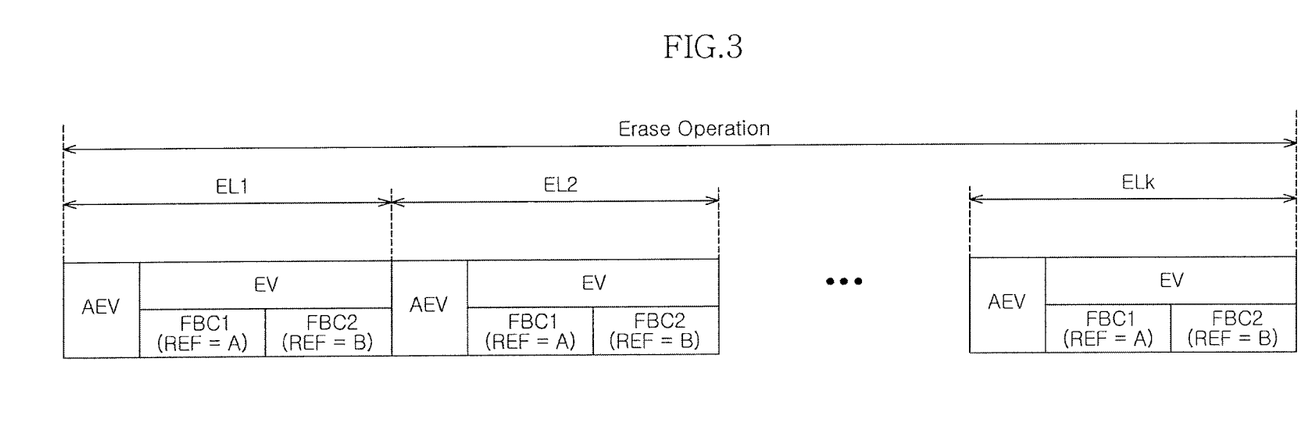
FIG. 3 is a simplified diagram illustrating an erase operation according to some embodiments.
Figure 4:
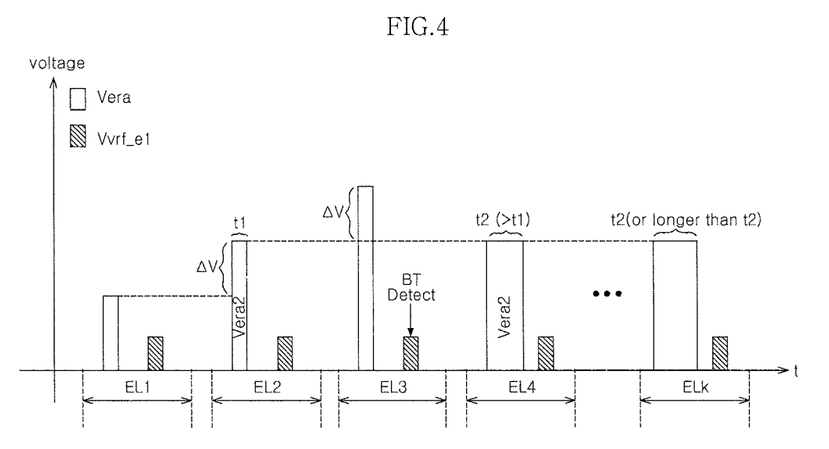
FIG. 4 is a simplified diagram explaining an erase voltage which is applied during a method of erasing according to some embodiments.

FIG. 3 is a simplified diagram illustrating an erase operation according to some embodiments. FIG. 4 is a simplified diagram explaining an erase voltage which is applied during a method of erasing according to some embodiments.

According to some embodiments, a charge trap device may be erased by a step pulse erasing method. According to the step pulse erasing method, a pulse of erase voltage is applied to the charge trap device, and an erase verify operation for checking whether the charge trap device is erased or not is then performed. An erase voltage application operation AEV and an erase verify operation EV form one erase loop EL. The erase loop EL is repeated until the charge trap device is erased. That is, a plurality of erase loops EL1 to ELk may be performed until the charge trap device is erased. Whenever the erase loop EL is repeated, the erase voltage is increased by a predetermined increment (for example, step voltage, step pulse, and/or ΔV). When back tunneling is detected in the charge trap device, an erase voltage to be used in a next erase loop EL is set to the erase voltage level used in a previous erase loop.

Referring to FIG. 3, the erase verify operation EV forming the erase loop EL includes two or more of fail bit check operations FBC. In some examples, the erase verify operation EV includes first and second fail bit check operations FBC1 and FBC2 to determine a number of failed bits of charge trap devices after one erase verify voltage is applied.

The first and second fail bit check operations FBC1 and FBC2 have different fail bit detection reference values. In some examples, the fail bit detection reference value A of the first fail bit check operation FBC1 may be larger than the fail bit detection reference value B of the second fail bit check operation FBC2. In some examples, the first fail bit check operation FBC1 may be performed to determine whether back tunneling occurred or not. In some examples, the second fail bit check operation FBC2 may be performed determine whether the erase operation passed or failed.

When a number of failed bits of the charge trap devices, determined using the erase verify voltage, is larger than the fail bit detection reference value A of the first fail bit check operation FBC1, the first fail bit check operation FBC1 is determined to be a fail. On the other hand, when the number of failed bits of the charge trap devices, determined using the erase verify voltage, is smaller than the fail bit detection reference value A of the first fail bit check operation FBC1, the first fail bit check operation FBC1 is determined to be a pass. When the number of failed bits of the charge trap devices, determined using the erase verify voltage, is larger than the fail bit detection reference value B of the second fail bit check operation FBC2, the second fail bit check operation FBC2 is determined to be a fail. On the other hand, when the number of failed bits of the charge trap devices, determined using the erase verify voltage, is smaller than the fail bit detection reference value B of the second fail bit check operation FBC2, the second fail bit check operation FBC2 is determined to be a pass.

According to some embodiments, back tunneling may be detected based on the result of the first fail bit check operation FBC1 performed in the current erase loop and the result of a first fail bit check operation FBC1 performed in a previous erase loop. In some examples, when the result of the first fail bit check operation FBC1 performed in the current erase loop is a fail and the result of the first fail bit check operation FBC1 performed in the previous erase loop is a pass, it may be determined that back tunneling occurred.

Referring to FIG. 4, when the result of a first fail bit check operation FBC1 performed in a second erase loop EL2 is a pass but the result of a first fail bit check operation FBC1 performed in a third erase loop EL3 is a fail, it may be determined that back tunneling occurred. This means that, because the threshold voltages of the charge trap devices increased when an erase voltage is applied during the third erase loop EL3, the number of charge trap devices failed in the third erase loop EL3 is larger than the number of charge trap devices failed in the second erase loop EL2.

When back tunneling is detected, an erase voltage having a same level as the erase voltage applied during the previous erase loop is applied during the next erase loop. In some examples, a time for which the erase voltage is applied during the next erase loop may be longer than a time for which the erase voltage is applied during the previous erase loop. That is, during the next erase loop, the erase voltage is applied for a longer time than the time for which the erase loop is applied during the previous erase loop.

Referring to the examples of FIG. 4, when back tunneling is detected during the current erase loop EL3, an erase voltage Vera2 having a same level as an erase voltage Vera2 applied in the previous erase loop EL2 is applied during the next erase loop EL4. Additionally, during the next erase loop EL4, the erase voltage is applied for a longer time t2 than a time t1 for which the erase voltage is applied during the previous erase loop EL2.

In some examples, the same erase voltage Vera2 is applied during each of the erase loops EL4 to ELk after back tunneling is detected during the erase loop EL3. In some examples, the erase voltage may be applied for the same time t2 during each of the erase loops EL4 to ELk after back tunneling is detected. In some examples, the time for which the erase voltage is applied may be gradually increased whenever the erase loop is repeated after back tunneling is detected.

Figure 5:
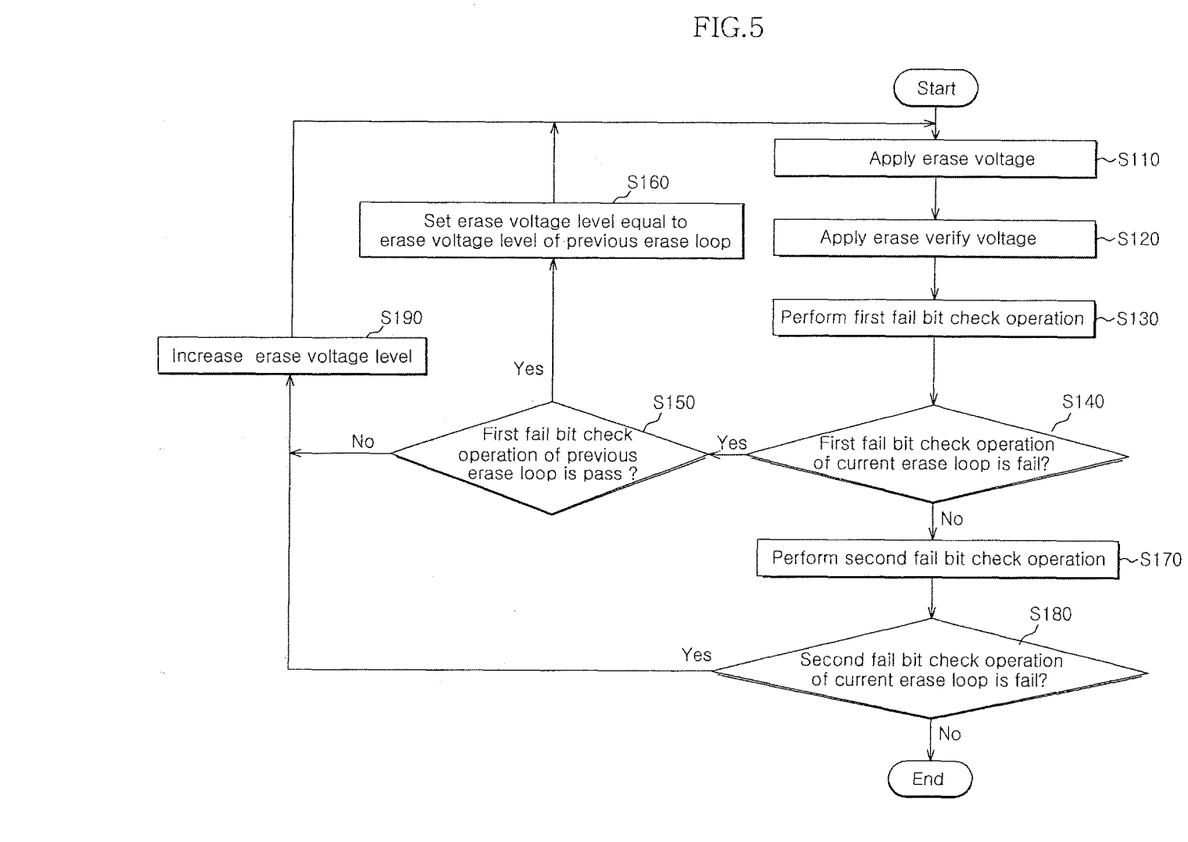
FIG. 5 is a simplified flowchart showing a method of erasing according to some embodiments.

FIG. 5 is a simplified flowchart showing a method of erasing according to some embodiments. In FIG. 5, suppose that the previous erase loop has already been performed. That is, suppose that a second fail bit check operation of the previous erase loop was failed, and thus another erase loop is to be performed. Furthermore, suppose that the result of a first fail bit check operation of the previous erase loop may be accessed.

At step S110, an erase voltage is applied to erase charge trap devices. In FIG. 5, suppose that the second fail bit check operation of the previous erase loop was failed and another erase loop is to be performed, as described above. Therefore, an erase voltage increased by a predetermined increment from the erase voltage applied during the previous erase loop may be applied at step S110.

At step S120, an erase verify voltage is applied to the charge trap devices to which the erase voltage is applied. Depending on the applied erase verify voltage, the states of the respective charge trap devices (for example, threshold voltages) are determined.

At step S130, a first fail bit check operation is performed based on the states of the charge trap devices to which the erase verify voltage is applied during the step S120. In some examples, a number of charge trap devices which are determined to be an erase fail based on the application of the erase verify voltage during the step S120, (i.e., the number of erase failed bits) is compared to a detection reference value of the first fail bit check operation.

At step S140, whether the first fail bit check operation of the current erase loop is failed or not is determined. As described above, when the number of erase failed bits is larger than the detection reference value of the first fail bit check operation, the first fail bit check operation is determined to be a fail. When the first fail bit check operation is determined to be a fail (Yes), the method proceeds to step S150. On the other hand, when the number of erase fail bits is smaller than the detection reference value of the first fail bit check operation, the first fail bit check operation is determined to be a pass. When the first fail bit check operation is determined to be a pass (No), the method proceeds to step S170.

At step S150, whether the first fail bit check operation of the previous erase loop was passed or not is determined. In FIG. 5, suppose that the previous loop was already performed, as described above. Thus, the result of the first fail bit check operation of the previous erase loop may be accessed. When the first fail bit check operation of the previous erase loop is determined to be a pass (Yes), the method proceeds to step S160. When the first fail bit operation of the previous erase loop was passed but the first fail bit operation of the current erase loop is failed, it means that the number of failed bits increased. That is, when the first fail bit check operation of the previous erase loop was passed but the first fail bit check operation of the current erase loop is failed, it means that charge trap devices were programmed despite the application of the erase voltage during step S110 of the current erase loop. In some examples, this means that back tunneling may have occurred. Therefore, the method proceeds to step S160. On the other hand, when the first fail bit check operation of the previous loop is determined to be a fail (No), the method proceeds to step S190. That is, when the first fail bit check operation of the previous erase loop was failed and the first fail bit check operation of the current erase loop is also failed, it may be determined that back tunneling did not occur, and the method proceeds to step S190.

At step S160, the erase voltage level is set to the same voltage level as an erase voltage level of the previous erase loop. The set erase voltage is then used in following erase loops. As described above, in some examples, a time for which the set erase voltage is applied during following erase loops may be increased. In some examples, the time for which the set erase voltage is applied during the following erase loops may be unchanged.

When it is determined through steps S140 and S150 that back tunneling did not occur, the method proceeds to step S190. At step S190, an erase voltage to be used for the next erase loop is increased. Then, the method proceeds to step S110 to perform the next erase loop.

When it is determined at step S140 that the first fail bit check operation of the current erase loop is passed (No), the method proceeds to step S170. At step S170, the second fail bit check operation is performed based on the states of the respective charge trap devices to which the erase verify voltage is applied. In some examples, a number of charge trap devices which are determined to be an erase fail by the application of the erase verify voltage (i.e., the number of erase failed bits) is compared to the detection reference value of the second fail bit check operation.

At step S180, whether the second fail bit check operation of the current erase loop is failed or not is determined. As described above, when the number of erase failed bits is larger than the detection reference value of the second fail bit check operation, the second fail bit check operation is determined to be a fail. As described above, the second fail bit check operation is performed to determine whether the erase operation is passed or failed. When the second fail bit check operation is determined to be a fail (Yes), the method proceeds to step S190. At step S190, the erase voltage to be used for the next erase loop is increased. Then, the method proceeds to step S110 to perform the next erase loop. On the other hand, when the number of erase failed bits is smaller than the detection reference value of the second fail bit check operation, the second fail bit check operation is determined to be a pass. When the second fail bit check operation is determined to be a pass (No), the method of erasing ends.

According to some embodiments, in the erasing method the first fail bit check operation for detecting back tunneling may be performed after the erase verify voltage is applied. Furthermore, back tunneling may be detected based on the result of the first fail bit check operation of the current erase loop and the result of the first fail bit check operation of the previous erase loop.

Figure 6:
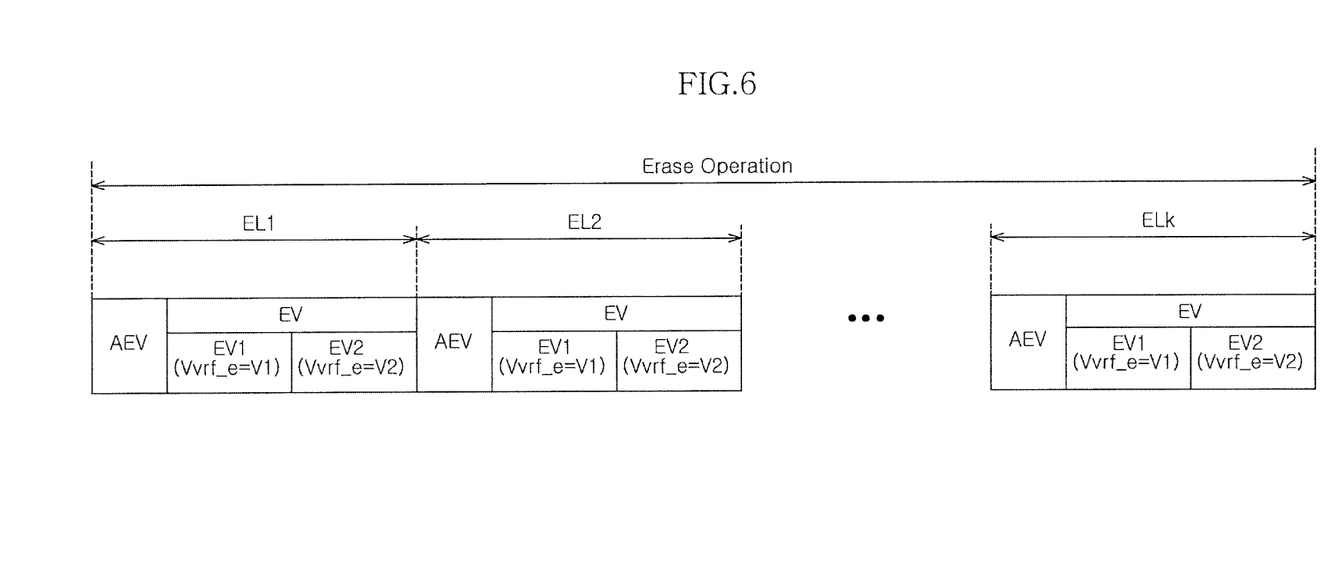
FIG. 6 is a simplified diagram illustrating an erase loop according to some embodiments.
Figure 7:
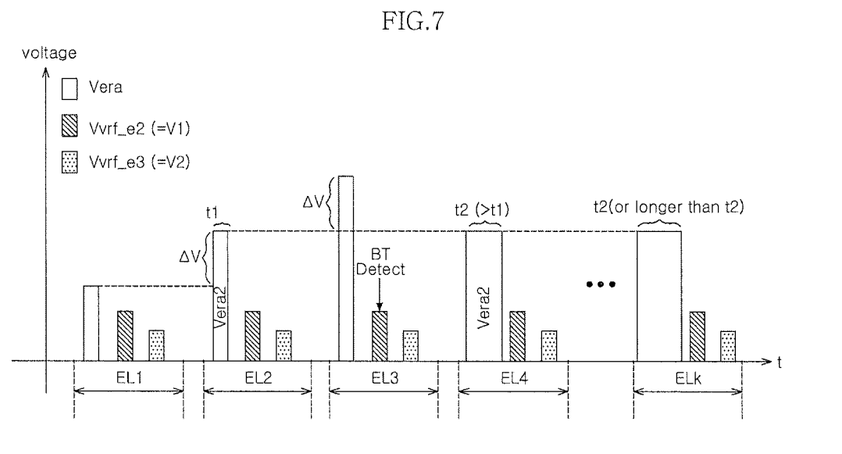
FIG. 7 is a simplified diagram explaining an erase voltage which is applied in a method of erasing according to some embodiments.

FIG. 6 is a simplified diagram illustrating an erase loop according to some embodiments. FIG. 7 is a simplified diagram explaining an erase voltage which is applied in a method of erasing according to some embodiments.

According to some embodiments, a charge trap device may be erased by a step pulse erasing method. According to the step pulse erasing method, a pulse of erase voltage is applied to the charge trap device, and an erase verify operation is then performed to check whether the charge trap device is erased. An erase voltage application operation AEB and an erase verify operation EV form one erase loop EL. The erase loop EL may be repeated until the charge trap device is erased. That is, a plurality of erase loops EL1 to ELk may be performed until the charge trap device is erased. Whenever the erase loop EL is repeated, the erase voltage is increased by a predetermined increment (for example, step voltage, step pulse, and/or $\Delta V$). When back tunneling is detected in the charge trap device, an erase voltage to be used in the next erase loop EL is set to an erase voltage level used in a previous erase loop.

Referring to FIG. 6, an erase verify operation EV forming the erase loop EL includes first and second erase verify operations EV1 and EV2. The first and second verification operations EV1 and EV2 have different erase verify voltages Vvrf_e from each other. In some examples, the level of an erase verify voltage V1 applied to the charge trap device during the first erase verify operation EV1 may be higher than the level of an erase verify voltage V2 applied to the charge trap device during the second erase verify operation EV2. In some examples, the first erase verify operation EV1 may be performed to determine whether back tunneling occurred or not. In some examples, the second erase verify operation EV2 may be performed to determine whether the erase operation is passed or failed.

In some examples, when it is determined that one or more of the charge trap devices or a predetermined number or more of the charge trap devices have a higher threshold voltage than the erase verify voltage V1, the first erase verify operation EV1 may be determined to be a fail. In some examples, when it is determined that all of the charge trap devices have a lower threshold voltage than the erase verify voltage V1, the first erase verify operation EV1 is determined to be a pass. In some examples, when it is determined that one or more of the charge trap devices or a predetermined number or more of the charge trap devices have a higher threshold voltage than the erase verify voltage V2, the second erase verify operation EV2 is determined to be a fail. In some examples, when it is determined that all of the charge trap devices have a lower threshold voltage than the erase verify voltage V2, the second erase verify operation EV2 is determined to be a pass.

According to some embodiments, back tunneling may be detected based on the result of the first erase verify operation EV1 performed during the current erase loop and the result of the first erase verify operation EV1 performed during the previous erase loop. In some examples, when the result of the first erase verify operation EV1 performed during the current erase loop is a fail and the result of the first erase verify operation EV1 performed during the previous erase loop is a pass, it may be determined that back tunneling occurred.

Referring to FIG. 7, when a first erase verify operation EV1 performed during a second erase loop EL2 is passed but a first erase verify operation EV1 performed in a third erase loop EL3 is failed, it may be determined that back tunneling occurred. In some examples, this means that, although the threshold voltages of all of the charge trap devices are lower than the erase verify voltage V1 during the second erase loop EL2, the threshold voltages of some of the charge trap devices are higher than the erase verify voltage V1 based on the erase voltage applied during the third erase loop EL3.

In some examples, when back tunneling is detected, the same erase voltage as the erase voltage applied during the previous erase loop may be applied during the next erase loop. In some examples, a time for which the erase voltage is applied during the next erase loop may be longer than a time for which the erase loop is applied during the previous erase loop. That is, during the next erase loop, the erase voltage may be applied for a longer time than the time for which the erase voltage is applied during the previous erase loop.

Referring to FIG. 7, when back tunneling is detected in a current erase loop EL3, an erase voltage Vera2 having a same level as an erase voltage Vera2 applied during the previous erase loop EL2 is applied during the next erase loop EL4. Furthermore, during the erase loop EL4, the erase voltage is applied for a longer time t2 than a time t1 for which the erase voltage is applied during the previous erase loop EL2.

In some examples, the same erase voltage Vera2 may be applied during each of the erase loops EL4 to ELk after back tunneling is detected. In some examples, when back tunneling is detected, the erase voltage may be applied for the same time t2 during each of the erase loops EL4 to ELk. In some examples, when back tunneling is detected, the time for which the erase voltage is applied may be gradually increased during subsequent erase loops.

Figure 8:
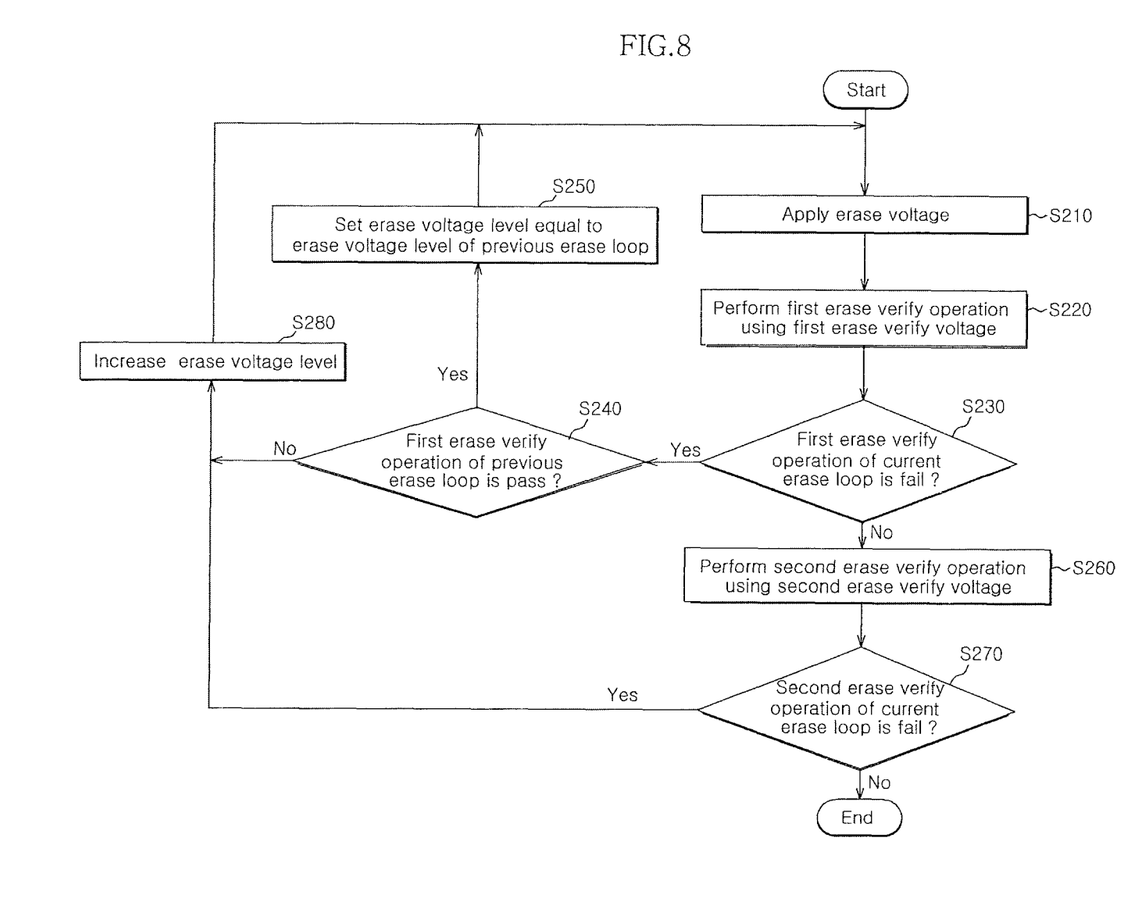
FIG. 8 is a simplified flowchart showing a method of erasing according to some embodiments.

FIG. 8 is a simplified flowchart showing a method of erasing according to some embodiments. In FIG. 8, suppose that the previous erase loop has already been performed. That is, suppose that a second fail bit check operation of the previous erase loop was failed, and thus another erase loop is to be performed. Furthermore, suppose that the result of a first fail bit check operation of the previous erase loop may be accessed.

At step S210, an erase voltage is applied to erase charge trap devices. In FIG. 8, suppose that the second fail bit check operation of the previous erase loop was failed and another erase loop is to be performed, as described above. Therefore, an erase voltage increased by a predetermined increment from the erase voltage applied during the previous erase loop may be applied at step S210.

At step S220, a first erase verify operation is performed using a first erase verify voltage. As described above, the first erase verify operation is performed to determine whether back tunneling occurred or not.

At step S230, whether the first erase verify operation of the current erase loop is failed or not is determined. As described above, when it is determined that one or more of the charge trap devices or a predetermined number of the charge trap devices have a higher threshold voltage than the first erase verify voltage, the first erase verify operation is determined to be a fail. When the first erase verify operation is determined to be a fail (Yes), the method proceeds to step S240. On the other hand, when it is determined that all of the charge trap devices have a lower threshold voltage than the first erase verify voltage, the first erase verify operation is determined to be a pass. When the first erase verify operation is determined to be a pass (No), the method proceeds to step S260.

At step S240, whether the first erase verify operation of the previous erase loop was passed or not is determined. In FIG. 8, suppose the previous erase loop was already performed, as described above. Thus, the result of the first erase verify operation of the previous erase loop may be accessed. When the first erase verify operation of the previous erase loop is determined to be a pass (Yes), the method proceeds to step S250. In some examples, when the first erase verify operation of the previous erase loop was passed but the first erase verify operation of the current erase loop is failed, it means there is at least one charge trap device with a higher threshold voltage than the first erase verify voltage applied during the step S220. That is, when the first erase verify operation of the previous erase loop was passed but the first erase verify operation of the current erase loop is failed, it means that the at least one charge trap device was programmed despite the application of the erase voltage during step S210 of the current erase loop. In some examples, this means that back tunneling occurred. Therefore, the method proceeds to step S250. On the other hand, when the first erase verify operation of the previous erase loop is determined to be a fail (No), the method proceeds to step S280. That is, when the first erase verify operation of the previous erase loop was failed and the first erase verify operation of the current erase loop is also failed, it may be determined that back tunneling did not occur, and the method proceeds to step S280.

At step S250, the erase voltage level is set to a same voltage level as an erase voltage level of the previous erase loop. The set erase voltage is then used during following erase loops. As described above, in some examples, a time for which the set erase voltage is applied during the following erase loops may be increased. In some examples, the time for which the set erase voltage is applied during the following erase loops may be unchanged.

When it is determined through steps S230 and S240 that back tunneling did not occur, the method proceeds to step S280. At step S280, an erase voltage to be used during the next erase loop is increased. Furthermore, the method returns to step S210 to perform the next erase loop.

When it is determined at step S230 that the first erase verify operation of the current erase loop is determined to be a pass (No), the method proceeds to step S260. At step S260, the second erase verify operation is performed using the second erase verify voltage. The second erase verify operation may be performed to determine whether the erase operation is passed or failed. Therefore, the second erase verify voltage used during the second erase verify operation has a lower level than the first erase verify voltage used during the first erase verify operation S220.

At step S270, whether the second erase verify operation of the current erase loop is failed or not is determined. As described above, when one or more charge trap devices or a predetermined number or more of charge trap devices are determined to have a higher threshold voltage than the second erase verify voltage, the second erase verify operation is determined to be a fail. When the second erase verify operation is determined to be a fail (Yes), the method proceeds to step S280. At step S280, an erase voltage to be used during the next erase loop is increased. Furthermore, the method proceeds to step S210 to perform the next erase loop. On the other hand, when all of the charge trap devices are determined to have a lower threshold voltage than the second erase verify voltage, the second erase verify operation is determined to be a pass. When the second erase verify operation is determined to be a pass (No), the method of erasing ends.

According to some embodiments, during the method of erasing, the first erase verify operation for detecting back tunneling may be performed during the erase verify operation. In some examples, back tunneling may be detected based on the result of the first erase verify operation of the current erase loop and the result of the first erase verify operation of the previous erase loop.

According to some embodiments, it may be possible to improve erase characteristics of nonvolatile memory devices including charge trap devices.

While certain embodiments have been described above, it will be understood to those skilled in the art that the embodiments described are by way of example only. Accordingly, the methods described herein should not be limited based on the described embodiments. Rather, the methods described herein should only be limited in light of the claims that follow when taken in conjunction with the above description and accompanying drawings.

What is claimed is:

1. A method of erasing charge trap devices, the method comprising:
applying a first erase voltage to the charge trap devices;
applying an erase verify voltage to the charge trap devices;
determining erase states of the charge trap devices;
performing a current first fail bit check operation comprising comparing a first number of charge trap devices, which are determined to be an erase fail based on the erase verify voltage, to a first reference value and determining a pass or fail based on the comparison result;
determining whether a previous first fail bit check operation of a previous erase loop was passed or not, when the current first fail bit check operation is determined to be a fail; and
applying a third erase voltage equal to a second erase voltage used in the previous erase loop during following erase loops, when the previous first fail bit check operation of the previous erase loop is determined to be a pass.

2. The method of claim 1, wherein when each of the following erase loops is performed, a first time for which the third erase voltage is applied is longer than a second time for which the second erase voltage is applied during the previous erase loop.

3. The method of claim 2, wherein the first time for which the third erase voltage is applied is increased whenever each of the following erase loops is performed.

4. The method of claim 2, wherein the first time for which the third erase voltage is applied is unchanged when each of the following erase loops is performed.

5. The method of claim 1, further comprising applying the third erase voltage to a higher level than the first erase voltage during a next erase loop, when the previous first fail bit check operation of the previous erase loop is determined to be a fail.

6. The method of claim 1, further comprising when the current first fail bit check operation is determined to be a pass, performing a current second fail bit check operation comprising comparing a second number of charge trap devices, which are determined to be an erase fail based on the first erase verify voltage, to a second reference value and determining a pass or fail based on the comparison result.

7. The method of claim 6, further comprising applying the third erase voltage to a higher level than the first erase voltage during a next erase loop, when the current second fail bit check operation is determined to be a fail.

8. The method of claim 6, wherein when the current second fail bit check operation is determined to be a pass, the method ends.

9. The method of claim 6, wherein the second reference value is smaller than the first reference value.

10. The method of claim 6, wherein an erase verify process comprises:
applying the erase verify voltage to the charge trap devices;
performing the current first fail bit check operation; and
performing the current second fail bit check operation.

11. The method of claim 10, wherein applying the first erase voltage to the charge trap devices and the erase verify process form one erase loop.

12. The method of claim 1, wherein the first erase voltage has a higher level than the second erase voltage.

13. A method of erasing charge trap devices, the method comprising:
applying a first erase voltage to the charge trap devices;
performing a current first erase verify operation comprising applying a first erase verify voltage to the charge trap devices, determining erase states of the charge trap devices, and determining a pass or fail depending on a first number of charge trap devices which are determined to be an erase fail based on the first erase verify voltage;
determining whether a previous first erase verify operation of a previous erase loop was passed or not, when the current first erase verify operation is determined to be a fail; and
applying a third erase voltage equal to a second erase voltage used in the previous erase loop during following erase loops, when the previous first erase verify operation of the previous erase loop is determined to be a pass.

14. The method of claim 13, wherein a first time for which the third erase voltage is applied during each of the following erase loops is longer than a second time for which the second erase voltage is applied during the previous erase loop.

15. The method of claim 14, wherein the first time for which the third erase voltage is applied is increased whenever each of the following erase loops is performed.

16. The method of claim 14, wherein the first time for which the third erase voltage is applied is unchanged when each of the following erase loops is performed.

17. The method of claim 13, further comprising applying the third erase voltage to a higher level than the first erase voltage during a next erase loop, when the previous first erase verify operation of the previous erase loop is determined to be a fail.

18. The method of claim 13, further comprising when the current first erase verify operation is determined to be a pass, performing a current second erase verify operation comprising applying a second erase verify voltage to the charge trap devices, determining erase states of the charge trap devices, and determining a pass or fail depending on a second number of charge trap devices which are determined to be an erase fail based on the second erase verify voltage.

19. The method of claim 18, further comprising applying the third erase voltage to a higher level than the first erase voltage during a next erase loop, when the current second erase verify operation is determined to be a fail.

20. The method of claim 18, wherein when the current second erase verify operation is determined to be a pass, the method ends.

21. The method of claim 18, wherein the second erase verify voltage is lower than the first erase verify voltage.

22. The method of claim 18, wherein applying the current first erase voltage to the charge trap devices, performing the first erase verify operation, and performing the current second erase verify operation form one erase loop.

23. The method of claim 13, wherein the second erase voltage has a higher level than the first erase voltage.

* * * * *